(12) United States Patent
Cao et al.

(10) Patent No.: US 12,356,755 B2
(45) Date of Patent: Jul. 8, 2025

(54) PHOTOVOLTAIC DEVICES AND SEMICONDUCTOR LAYERS WITH GROUP V DOPANTS AND METHODS FOR FORMING THE SAME

(71) Applicant: First Solar, Inc., Tempe, AZ (US)

(72) Inventors: Hongbo Cao, Cohoes, NY (US); Sachit Grover, Campbell, CA (US); William Hullinger Huber, Ottawa Hills, OH (US); Xiaoping Li, San Jose, CA (US); Dingyuan Lu, San Jose, CA (US); Roger Malik, Santa Clara, CA (US); Hongying Peng, Clifton Park, NY (US); Joseph John Shiang, Niskayuna, NY (US); Qianqian Xin, Shanghai (CN); Gang Xiong, Santa Clara, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 17/986,747

(22) Filed: Nov. 14, 2022

(65) Prior Publication Data

US 2023/0082990 A1    Mar. 16, 2023

Related U.S. Application Data

(62) Division of application No. 16/770,388, filed as application No. PCT/CN2017/114980 on Dec. 7, 2017, now Pat. No. 11,502,212.

(51) Int. Cl.
| | |
|---|---|
| H10F 77/123 | (2025.01) |
| H10F 10/162 | (2025.01) |
| H10F 71/00 | (2025.01) |

(52) U.S. Cl.
CPC ....... H10F 77/1233 (2025.01); H10F 10/162 (2025.01); H10F 71/1253 (2025.01); H10F 71/128 (2025.01); H10F 77/1237 (2025.01)

(58) Field of Classification Search
CPC ......... H01L 31/02963; H01L 31/02966; H01L 31/073; H01L 31/1832; H01L 31/1864
See application file for complete search history.

(56) References Cited

U.S. PATENT DOCUMENTS 4,950,615 A    8/1990 Basol et al.
5,501,744 A *  3/1996 Albright ............... H01L 31/073
                                         257/E27.125
(Continued)

FOREIGN PATENT DOCUMENTS

CN    102810598 A    12/2012
JP    H0685297 A     3/1994
(Continued)

OTHER PUBLICATIONS

Korevaar (Year: 2014).*
(Continued)

*Primary Examiner* — Sadie White
(74) *Attorney, Agent, or Firm* — MacMillan, Sobanski & Todd, LLC

(57) ABSTRACT

According to the embodiments provided herein, a photovoltaic device can include an absorber layer. The absorber layer can be doped p-type with a Group V dopant and can have a carrier concentration of the Group V dopant greater than $4 \times 10^{15}$ cm$^{-3}$. The absorber layer can include oxygen in a central region of the absorber layer. The absorber layer can include an alkali metal in the central region of the absorber layer. Methods for carrier activation can include exposing an absorber layer to an annealing compound in a reducing environment. The annealing compound can include cadmium chloride and an alkali metal chloride.

17 Claims, 3 Drawing Sheets

(56) References Cited

U.S. PATENT DOCUMENTS

| | | |
|---|---|---|
| 9,263,608 B2 | 2/2016 | Powell et al. |
| 9,608,144 B2 | 3/2017 | Mitchinson et al. |
| 9,871,154 B2 | 1/2018 | Duggal et al. |
| 10,141,463 B2 | 11/2018 | Korevaar et al. |
| 10,243,092 B2 | 3/2019 | Damjanovic et al. |
| 10,319,873 B2 | 6/2019 | Powell et al. |
| 10,529,883 B2 | 1/2020 | Damjanovic et al. |
| 10,861,994 B2 | 12/2020 | Abken et al. |
| 11,158,749 B2 | 10/2021 | Grover et al. |
| 11,201,257 B2 | 12/2021 | Grover et al. |
| 11,342,471 B2 | 5/2022 | Grover et al. |
| 11,502,212 B2 | 11/2022 | Cao et al. |
| 11,588,069 B2 | 2/2023 | Andreini et al. |
| 11,695,085 B2 | 7/2023 | Jayamaha et al. |
| 11,769,844 B2 | 9/2023 | Damjanovic et al. |
| 11,791,427 B2 | 10/2023 | Grover et al. |
| 11,843,070 B2 | 12/2023 | Abken et al. |
| 11,876,140 B2 | 1/2024 | Blaydes et al. |
| 11,929,447 B2 | 3/2024 | Brubaker et al. |
| 2008/0251119 A1 | 10/2008 | Forehand |
| 2009/0194166 A1* | 8/2009 | Powell ............ H01L 31/02963 438/57 |
| 2010/0012188 A1 | 1/2010 | Garnett |
| 2010/0273287 A1* | 10/2010 | Weiner ............ H01L 31/03923 257/E31.015 |
| 2012/0325298 A1* | 12/2012 | Johnson ............ C23C 14/0629 438/57 |
| 2013/0074914 A1 | 3/2013 | Foust et al. |
| 2013/0180579 A1* | 7/2013 | Jin ................ H01L 31/075 136/255 |
| 2013/0192667 A1 | 8/2013 | Cao et al. |
| 2013/0230944 A1* | 9/2013 | Feldman-Peabody ................ H01L 31/1828 257/E31.032 |
| 2013/0327398 A1* | 12/2013 | Dhere ............ H01L 31/073 438/93 |
| 2013/0337600 A1 | 12/2013 | Cao et al. |
| 2014/0326315 A1 | 11/2014 | Blaydes et al. |
| 2014/0360565 A1 | 12/2014 | Blaydes et al. |
| 2014/0373908 A1 | 12/2014 | Duggal et al. |
| 2016/0126396 A1 | 5/2016 | Damjanovic et al. |
| 2020/0035844 A1 | 1/2020 | Grover et al. |
| 2021/0091250 A1 | 3/2021 | Abken et al. |

FOREIGN PATENT DOCUMENTS

| | | |
|---|---|---|
| JP | H8500209 A | 1/1996 |
| JP | 2000100834 A | 4/2000 |
| WO | 9314523 | 7/1993 |
| WO | 2013177048 A2 | 11/2013 |
| WO | 2018156698 A1 | 8/2018 |

OTHER PUBLICATIONS

The Extended European Search Report, Application No. 17934240.7, dated Sep. 4, 2020.
PCT International Search Report and Written Opinion, Application No. PCT/CN2017/114980, dated Sep. 5, 2018.
PCT Notification of Decision Concerning Request for Rectification, Application No. PCT/CN2017/114980, dated Sep. 4, 2018.
Japanese Patent Office, Notification of Reason(s) for Rejection, dated Oct. 5, 2021, JP Application No. 2020-531089.
Intellectual Property India, Examination Report, dated Feb. 3, 2022, Application No. 202017023424.
Extended European Search Report, dated Mar. 9, 2022, Application No. 22155897.6.

* cited by examiner

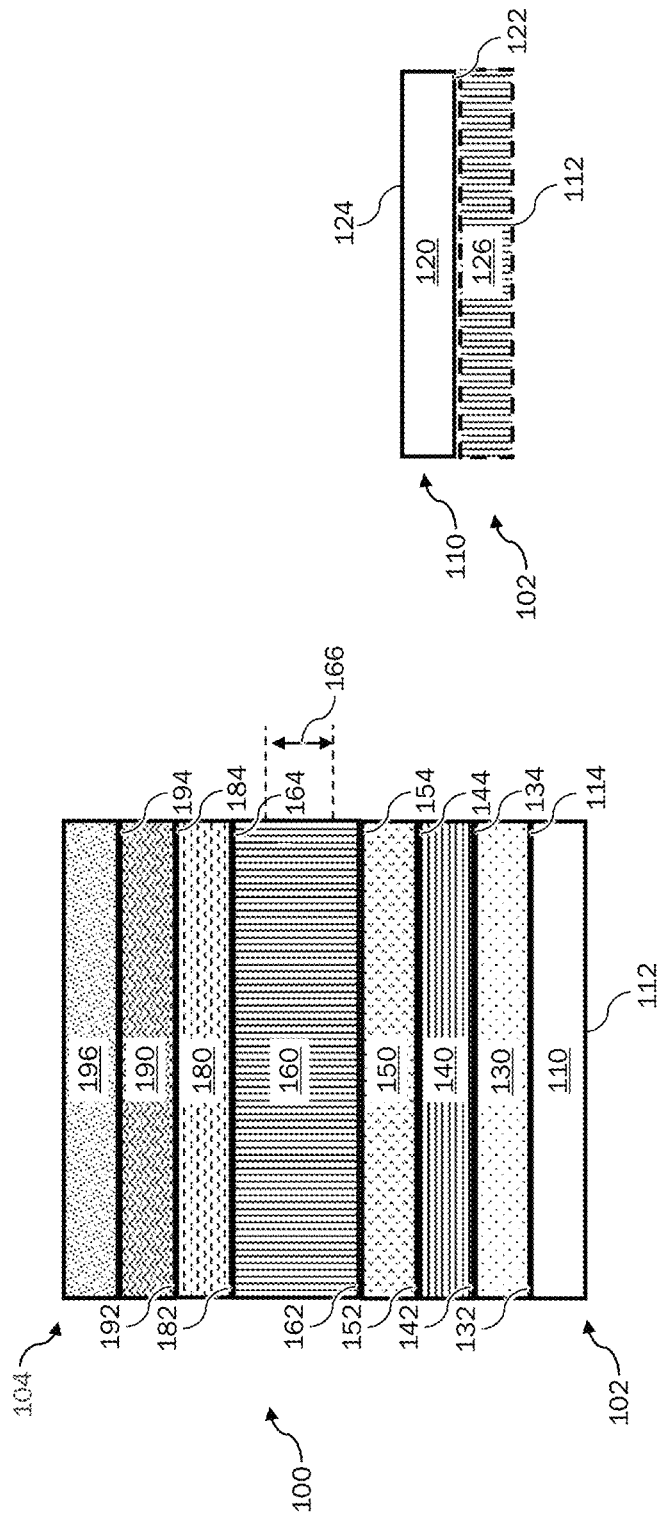

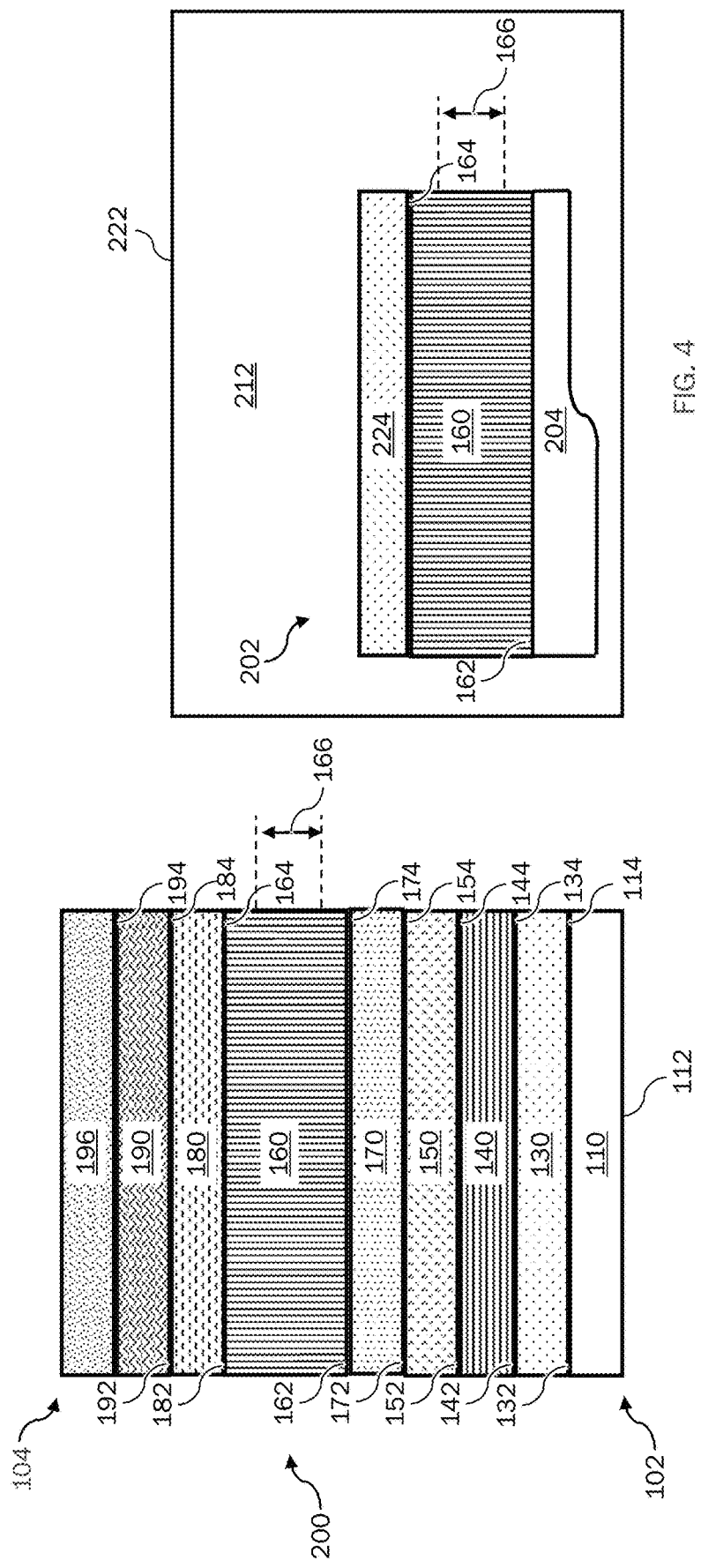

PHOTOVOLTAIC DEVICES AND SEMICONDUCTOR LAYERS WITH GROUP V DOPANTS AND METHODS FOR FORMING THE SAME

CROSS-REFERENCE TO RELATED APPLICATIONS

This is a divisional application of U.S. patent application Ser. No. 16/770,388, now U.S. Pat. No. 11,502,212, granted Nov. 15, 2022, which entered the U.S. national phase on Jun. 5, 2020, from the International Patent Application PCT/CN2017/114980, filed on Dec. 7, 2017, each of which is incorporated by reference in the entirety.

BACKGROUND

The present specification generally relates to efficient photovoltaic devices and methods for forming the same and, more specifically, to photovoltaic devices and semiconductor layers with group V having enhanced carrier concentration and methods for forming the same.

A photovoltaic device generates electrical power by converting light into electricity using semiconductor materials that exhibit the photovoltaic effect. Unfortunately, the manufacturing processes necessary to efficiently produce the photovoltaic device can exacerbate undesirable properties of the photovoltaic device. For example, semiconductor layers are sometimes subjected to chloride heat treatment (CHT), which is an annealing process in a chlorine and oxygen containing atmosphere. The CHT can improve the crystalline quality of the semiconductor layer. For example, the grain (crystallite) size can be increased. Also, defects in the lattice structure can be cured including, for example, defects located at grain boundary areas. Defects in the lattice structure can be sources of carrier recombination, which reduces photovoltaic efficiency.

The semiconductor layer can be doped with materials, i.e., dopants, which can be activated to increase the charge carrier concentration of the semiconductor layer. The addition of dopants to a semiconductor layer can produce a material layer with predominantly negative, n-type, or positive, p-type, charge carriers. However, subjecting a doped semiconductor layer to the CHT can result in a doped semiconductor layer with an insufficient charge carrier concentration, i.e., the charge carrier concentration can be too low. For example, a large of a proportion of the dopant can fail to activate, and fail to contribute to the generation of electrical power.

Accordingly, a need exists for alternative photovoltaic devices and alternative semiconductor layers with group V having enhanced carrier concentration, and alternative methods for forming the same.

SUMMARY

The embodiments provided herein relate to methods for performing alkali and reduced-ambient heat treatments and photovoltaic devices formed according to the same. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 1 schematically depicts a photovoltaic device according to one or more embodiments shown and described herein;

FIG. 2 schematically depicts a substrate according to one or more embodiments shown and described herein;

FIG. 3 schematically depicts a photovoltaic device according to one or more embodiments shown and described herein;

FIGS. 4 and 5 schematically depict partially formed photovoltaic devices according to one or more embodiments shown and described herein.

DETAILED DESCRIPTION

Figure 6:
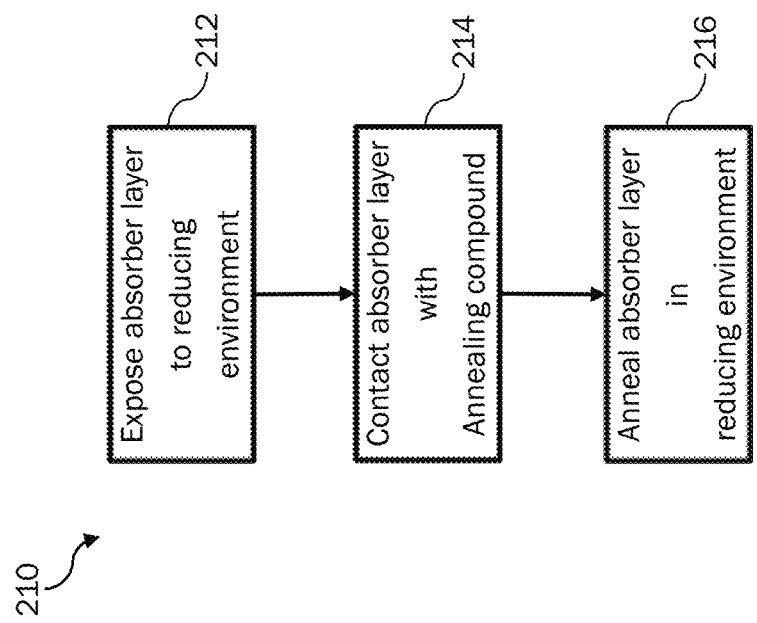
FIG. 6 schematically depicts a method for performing an alkali and reduced-ambient heat treatment according to one or more embodiments shown and described herein.

Embodiments of a photovoltaic device for generating electrical power from light are described herein. The photovoltaic device generally includes an absorber layer formed from a semiconductor material. The absorber layer can be subjected to one or more processing steps configured to activate the dopant. As used herein, activate or activation can mean manipulating a dopant such that the dopant operates as a charge carrier within a semiconductor, e.g., activated p-type dopants operate as acceptors. Various embodiments of the photovoltaic device and methods for activating the dopants of the absorber layer of the photovoltaic device will be described in more detail herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" refers to a thickness of material provided upon a surface. Each layer can cover all or any portion of the surface.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 450 nm to about 800 nm in some embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 140 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring again to FIG. 1, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 2 μm to about 5 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising from cadmium, tellurium, selenium, or any combination thereof. Suitable examples include, but are not limited to, cadmium telluride, ternaries of cadmium, selenium and tellurium (e.g., $CdSe_xTe_{1-x}$), or quaternaries comprising cadmium, selenium and tellurium. In embodiments where the absorber layer 160 comprises selenium and cadmium, the atomic percent of the selenium can be greater than about 0 atomic percent and less than about 20 atomic percent. In embodiments where the absorber layer 160 comprises tellurium and cadmium, the atomic percent of the tellurium can be greater than about 30 atomic percent and less than about 50 atomic percent. It is noted that the atomic percent described herein is representative of the entirety of the absorber layer 160, the atomic percentage of material at a particular location within the absorber layer 160 can vary with thickness compared to the overall composition of the absorber layer 160. It is noted that the concentration of tellurium, selenium, or both can vary through the thickness of the absorber layer 160. For example, when the absorber layer 160 comprises a ternary of cadmium, selenium, and tellurium ($CdSe_xTe_{1-x}$), x can vary in the absorber layer 160 with distance from the first surface 162 of the absorber layer 160. In some embodiments, the value of x can decrease in the absorber layer 160 with distance from the first surface 162 of the absorber layer 160.

According to the embodiments provided herein, the dopant within the absorber layer 160 can be activated to a desired charge carrier concentration. In some embodiments, the absorber layer 160 can be doped with a group V dopant such as, for example, nitrogen (N), phosphorous (P), arsenic (As), antimony (Sb), bismuth (Bi), ununpentium (Uup), or a combination thereof. The total dosage of the dopant within the absorber layer 160 can be controlled. In some embodiments, an atomic concentration of Group V dopant in a central region 166 the absorber layer 160 can be greater than about $1 \times 10^{17}$ cm$^{-3}$ such as, for example, between about $1 \times 10^{17}$ cm$^{-3}$ and about $5 \times 10^{20}$ cm$^{-3}$ in one embodiment, between about $3 \times 10^{17}$ cm$^{-3}$ and about $1 \times 10^{19}$ cm$^{-3}$ in another embodiment, or between about $5 \times 10^{17}$ cm$^{-3}$ and about $5 \times 10^{18}$ cm$^{-3}$ in a further embodiment. The central region 166 is the middle 50% of the absorber layer 160, which is offset by 25% of the thickness of the absorber layer 160 from each of the first surface 162 and the second surface 164 of the absorber layer 160. Alternatively or additionally, the concentration profile of the group V dopant can vary through the thickness of the absorber layer 160. Specifically, the amount of the group V dopant can vary with distance from the first surface 162 of the absorber layer 160.

Referring still to FIG. 1, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Referring now to FIG. 3, in some embodiments, a photovoltaic device 200 can include a window layer 170 comprising n-type semiconductor material. Aside from the window layer 170, the photovoltaic device 200 can have a substantially similar layer structure as the photovoltaic device 100 (FIG. 1). The absorber layer 160 can be formed adjacent to the window layer 170. The window layer 170 can have a first surface 172 substantially facing the energy side 102 of the photovoltaic device 200 and a second surface 174 substantially facing the opposing side 104 of the photovoltaic device 200. In some embodiments, the window layer 170 can be positioned between the absorber layer 160 and the TCO layer 140. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring again to FIG. 1, the photovoltaic device 100 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Referring collectively to FIGS. 1 and 3, manufacturing of a photovoltaic device 100, 200 generally includes sequentially disposing functional layers or layer precursors in a "stack" of layers through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). Once a layer is formed it may be desirable to modify the physical characteristics of the layer through subsequent treatment processes.

Figure 5:
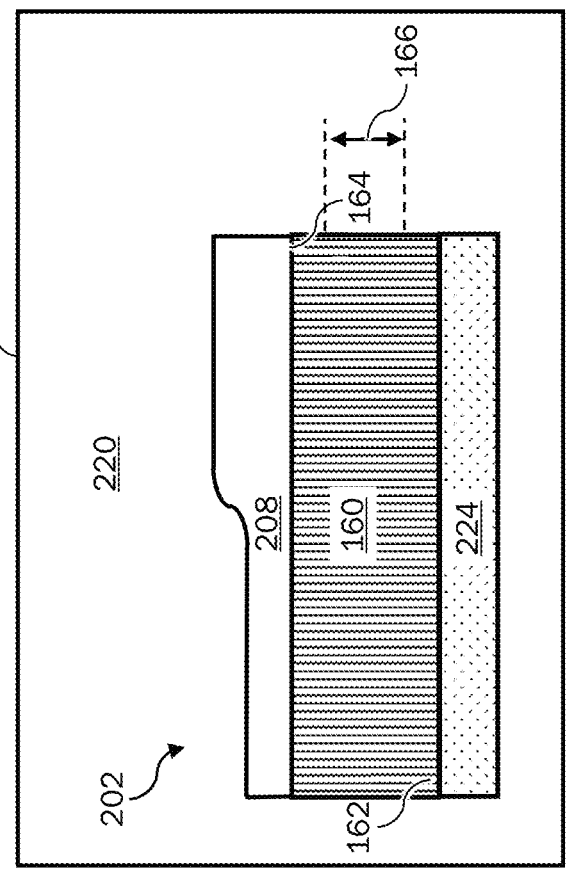

Referring collectively to FIGS. 4 and 5, a layer of a partially formed device can be processed. In some embodiments, a partially formed photovoltaic device 202 can comprise the absorber layer 160 adjacent to a layer stack 204. The layer stack 204 can include one or more of the layers of the photovoltaic device 100, 200 (FIGS. 1 and 3) disposed between the absorber layer 160 and the energy side 102. Alternatively, a partially formed photovoltaic device 206 can comprise the absorber layer 160 adjacent to a layer stack 208. The layer stack 208 can include one or more of the layers of the photovoltaic device 100, 200 (FIGS. 1 and 3) between the absorber layer 160 and the opposing side 104.

Referring now to FIG. 6, a method 210 for performing an alkali and reduced-ambient heat treatment (ARHT) is depicted. The ARHT is an annealing process that employs a chemical compound and a reducing atmosphere. In some embodiments, the absorber layer 160 can be doped with a group V dopant prior to being subjected to the ARHT. The ARHT can be used to activate dopants within the absorber layer 160. As is explained in greater detail herein, the ARHT can activate a larger number of dopants and generate a larger carrier concentration than other heat treatment processes, while providing sufficient grain growth within the absorber layer 160.

Referring collectively to FIGS. 4, 5, and 6, the method 210 for performing the ARHT can include a process 212 for exposing the absorber layer 160 to a reducing environment 220. The first surface 162 or the second surface 164 of the absorber layer 160 can be subjected to the reducing environment 220. The reducing environment 220 is an atmospheric condition in which oxidation is mitigated by removal of oxygen and other oxidizing gases or vapors, i.e., the reducing environment can be substantially free of substances tending to oxidize the Group V dopants. Additionally, the reducing environment 220 can include a forming gas configured to mitigate the formation of group V oxides. The forming gas can be energetically more favorable to oxidation than the group V dopant, i.e., an oxidation reaction of the forming gas during the ARHT can have a more negative Gibbs free energy change ($\Delta G$) than the group V dopant.

In some embodiments, the forming gas can comprise hydrogen, nitrogen, or combinations thereof. In one embodiment, the forming gas consists essentially of a mixture of $H_2$ and $N_2$. For example, the forming gas can comprise a mixture of about 50.0 to 99.4% $N_2$ and about 0.6 to 3.0% $H_2$. Alternatively, the forming gas can comprise $H_2$ in an atomic fraction range of 0.5-100%. Thus, the reducing environment 220 can comprise a forming gas consisting essentially of 100% $H_2$. Other suitable reducing agents can include methane ($CH_4$), carbon monoxide (CO), hydrogen sulfide ($H_2S$), and ammonia compounds ($NH_3$). In some embodiments, the reducing environment 220 can be provided within a processing chamber 222 configured to substantially prevent the inclusion of substances tending to oxidize Group V dopants within the reducing environment 220. Accordingly, in some embodiments, the reducing environment 220 can consist essentially of the forming gas. Alternatively or additionally, the processing chamber 222 can be configured to maintain partial vacuum pressure. Accordingly, the reducing environment 220 can be provided at a vacuum pressure in a range of about 200 Torr to about 800 Torr such as, for example, in a range of about 3 Torr to about 50 Torr.

The method 210 for performing the ARHT can include a process 214 for contacting the absorber layer 160 with an annealing compound 224. In some embodiments, the annealing compound 224 can be applied to the first surface 162 or the second surface 164 of the absorber layer 160 as a solution. For example, the annealing compound 224 can be sprayed, spin coated, or roll coated upon the absorber layer 160. Alternatively or additionally, the annealing compound 224 can be supplied as a vapor in the processing chamber 222. The annealing compound 224 comprises a combination of cadmium chloride ($CdCl_2$) and one or more alkali metal chloride. The alkali metal chlorides can be formed from an alkali metal such as, for example, lithium (Li), sodium (Na), potassium (K), rubidium (Rb), cesium (Cs), and francium (Fr). Suitable alkali metal chlorides include, but are not limited to, LiCl, NaCl, KCl, RbCl, or combinations thereof. The composition of the annealing compound 224 is controlled such that a desired ratio of alkali metal to cadmium to is maintained. Generally, the annealing compound 224 includes much more cadmium than alkali metal as measured by atomic ratio. For example, the desired ratio of alkali metal to cadmium to is less than about 10,000 parts per million (ppm) such as, for example, between about 500 ppm to about 6,000 ppm in one embodiment, between about 750 ppm to about 4,500 ppm in another embodiment, or between about 1,000 ppm and about 3,000 ppm in a further embodiment.

The method 210 for performing the ARHT can include a process 216 for annealing the absorber layer 160 in the reducing environment 220. Generally, annealing includes heating the absorber layer 160 (e.g., polycrystalline semiconductor material) for sufficient time and temperature to facilitate re-crystallization of the absorber layer 160. For example, the absorber layer 160 can be processed at a temperature between about 350° C. and about 500° C. for between about 5 minutes and about 60 minutes such as, for example, at a temperature in a range of about 400° C. to about 500° C. for a duration of about 10 minutes to about 55 minutes, in one embodiment, or at a temperature in a range of about 400° C. to about 450° C. for a duration of about 15 minutes to about 50 minutes, in another embodiment. It is noted that, while process 212, process 214, and process 216 may be depicted in a sequential manner in FIG. 6, the embodiments provided herein are not limited to any particular order of process 212, process 214, and process 216. In some embodiments, a surface of the absorber layer 160 can be initially contacted with the annealing compound 224 while in the reducing environment 220, and during annealing. In other embodiments, a surface of the absorber layer 160 can be contacted with the annealing compound 224 and subsequently placed in the reducing environment 220 and annealed. In some embodiments, each of process 212, process 214, and process 216 can be performed contemporaneously, i.e., the annealing compound 224 can remain in contact with the absorber layer 160 for at least a portion of the annealing in the reducing environment 220.

In addition to recrystallization of the absorber layer 160, which can be formed from polycrystalline semiconductors, the ARHT can result in grain growth in the absorber layer 160. Moreover, the constituents (e.g., alkali metal, chlorine, or both) of the annealing compound 224 can diffuse into absorber layer 160 and impact the activation of group V dopants present in the absorber layer. As is explained in greater detail herein, the diffusion of constituents of the annealing compound 224 into other layers of the layer stack 204, 206 can impact the overall device efficiency.

Referring again to FIGS. 1 and 3, after ARHT, the absorber layer 160 can comprise a relatively high carrier concentration compared to previously known processes such as, for example, CHT. For Cu-doped CdTe absorber devices subjected to CHT, the nominal carrier concentration can often be below about $1 \times 10^{15}$ cm$^{-3}$. In contrast, absorber layers 160 of the present disclosure such as, for example, absorber layers 160 with group V dopants and comprising cadmium and tellurium or cadmium, selenium and tellurium, achieve carrier concentrations in the absorber layer 160 greater than about $4 \times 10^{15}$ cm$^{-3}$. In some embodiments, the carrier concentration of the absorber layer 160 is greater than about $8 \times 10^{15}$ cm$^{-3}$ such as, for example, greater than about $1 \times 10^{16}$ cm$^{-3}$ in one embodiment, or between about $8 \times 10^{15}$ cm$^{-3}$ and about $6 \times 10^{16}$ cm$^{-3}$ in another embodiment.

As is noted above, ARHT is performed in a reducing environment 220 to reduce the presence of oxygen. However, in some embodiments, oxygen can diffuse into the central region 166 of the absorber layer 160. In such embodiments, the central region 166 of the absorber layer 160 can have an alkali to oxygen ratio, i.e., the ratio of the atomic concentration of an alkali metal to the atomic concentration of oxygen at the measured depth, in a desired range. The alkali to oxygen ratio can be at least 0.1 in the central region 166 of the absorber layer 160 such as for example, an alkali to oxygen ratio of at least 0.75 in one embodiment, an alkali to oxygen ratio of at least 5 in another embodiment, an alkali to oxygen ratio of between about 10 and about 1,000 in a further embodiment, or an alkali to oxygen ratio of between about 10 and about 100 in yet another embodiment.

According to the embodiments provided herein, the atomic concentration of the alkali metal in the absorber layer can be greater than about $1 \times 10^{16}$ $cm^{-3}$. In some embodiments, the atomic concentration of alkali metal in the absorber layer 160 is greater than about $2 \times 10^{16}$ $cm^{-3}$ such as, for example, greater than about $1 \times 10^{17}$ $cm^{-3}$ in one embodiment, or between about $5 \times 10^{16}$ $cm^{-3}$ and about $1 \times 10^{19}$ $cm^{-3}$ in another embodiment. The alkali metal can further diffuse into other layers of the photovoltaic device 100, 200. In some embodiments, the alkali metal can diffuse into the TCO layer 140. Generally, the atomic concentration of the alkali metal in the TCO layer 140 is greater than the atomic concentration of the alkali metal in the absorber layer 160.

Applicant has discovered that excessive concentration of the alkali metal is correlated to degradation of the sheet resistance of the TCO layer 140. Accordingly, an alkali metal ratio between the TCO layer 140 and the absorber layer 160, i.e., ratio of the atomic concentration of alkali metal in the TCO layer 140 to the atomic concentration of the alkali metal in the absorber layer 160 can be controlled. In some embodiments, the alkali metal ratio between the TCO layer 140 and the absorber layer 160 can be less than about 1,000 such as, for example, less than about 500 in one embodiment, or less than about 100 in another embodiment. Applicant has further discovered that potassium (K) and rubidium (Rb) have demonstrated improved performance with respect to sheet resistance compared to other alkali metals. Indeed, the presence of potassium (K) and rubidium (Rb) has demonstrated improved performance compared to cadmium chloride based annealing compounds without any alkali metals. Accordingly, in some embodiments, the alkali metal can consist of potassium (K), rubidium (Rb), or both.

TABLE 1

| | Annealing Compound | Alkali Concentration (ppm) | Eff (%) | Carrier concentration |
|---|---|---|---|---|
| Comparative Example | $CdCl_2$ | 0 | 10 | $3 \times 10^{15}$ $cm^{-3}$ |
| Example 1 | $CdCl_2$ + LiCl | 3000 | 11 | $4 \times 10^{15}$ $cm^{-3}$ |
| Example 2 | $CdCl_2$ + LiCl + KCl | 3000 | 16.5 | $4 \times 10^{15}$ $cm^{-3}$ |
| Example 3 | $CdCl_2$ + KCl | 2000 | 18 | $2 \times 10^{16}$ $cm^{-3}$ |
| Example 4 | $CdCl_2$ + KCl | 3000 | 17.5 | $2 \times 10^{16}$ $cm^{-3}$ |
| Example 5 | $CdCl_2$ + RbCl | 1000 | 16 | $8 \times 10^{15}$ $cm^{-3}$ |
| Example 6 | $CdCl_2$ + RbCl | 2000 | 18.2 | $1.5 \times 10^{16}$ $cm^{-3}$ |
| Example 7 | $CdCl_2$ + RbCl | 3000 | 17 | $4.5 \times 10^{16}$ $cm^{-3}$ |

Referring to Table 1, above, the annealing compound column of Table 1 summarizes the presence of cadmium chloride and alkali metal chlorides in the annealing compound. The alkali concentration column summarizes the atomic ratio of alkali metal to cadmium in parts per million in the annealing compound. Each of Comparative Example and Examples 1-7 were processed with similar annealing compounds with the differences summarized in the annealing compound and alkali concentration columns of Table 1. Accordingly, Examples 1-7 were processed according to the ARHT process described herein. Comparative Example 1 can be considered analogous to a CHT process, except the CHT was performed in a reducing atmosphere. The efficiency column summarizes the measured efficiency of photovoltaic devices with absorber layers processed as summarized in Table 1, and after device integration. The absorber layers of the compounds were substantially similar and comprised cadmium and tellurium. Each of the absorber layers were doped with about $1 \times 10^{18}$ $cm^{-3}$ of arsenic (As), which was verified using dynamic secondary ion mass spectrometry (SIMS). The carrier concentration column summarizes the carrier concentration of the absorber layers processed as summarized in Table 1, and after device integration. The carrier concentration numbers were derived from capacitance-voltage (C-V) measurements.

As summarized above in Table 1, each of Examples 1-7 demonstrated an improvement in efficiency and carrier concentration compared to Comparative Example 1. Additionally, Examples 3-4, which included potassium (K) demonstrated improved efficiency and carrier concentration compared to Examples 1 and 2, which included lithium (Li). Likewise, Examples 6-7, which include rubidium (Rb) demonstrated improved efficiency and carrier concentration compared to Examples 1 and 2.

It should now be understood that the embodiments provided herein, relate to ARHT methods that enhance Group V doping activation. Photovoltaic devices formed using the ARHT methods described herein demonstrated relatively high carrier concentration. Accordingly, the embodiments provided herein resolve some of the challenges associated with photovoltaic devices having absorber layers that include cadmium and tellurium. Such devices can struggle to achieve high p-type carrier concentration. For Cu-doped CdTe based devices, the nominal carrier concentration can be below $3 \times 10^{15}$ $cm^{-3}$, which results in poor device performance (e.g., efficiency).

Moreover, ARHT methods described herein results in devices having sufficient grain growth in the absorber layer. For example, previously known processes such as, for example, CHT, when performed in a reducing environment, lack sufficient grain growth. Without being bound to theory, it is believed that the due to the lack of oxygen, previously known processes yield absorber layers with small grain and poor carrier concentration stability. The ARHT methods described herein yield desirable grain growth.

According to the embodiments provided herein, a photovoltaic device can include an absorber layer. The absorber layer can include cadmium, tellurium, and selenium. The absorber layer can be doped p-type with a Group V dopant and can have a carrier concentration of the Group V dopant greater than $4 \times 10^{15}$ $cm^{-3}$. The absorber layer can include oxygen in a central region of the absorber layer. The absorber layer can include an alkali metal in the central region of the absorber layer. A ratio of an atomic concentration of the alkali metal to an atomic concentration of the oxygen can be at least 0.1 in the central region of the absorber layer.

According to the embodiments, a method for carrier activation can include exposing an absorber layer to a reducing environment. The absorber layer can include cadmium, tellurium, selenium, and a Group V dopant. The method for carrier activation can include contacting the absorber layer with an annealing compound. The annealing compound can include cadmium chloride and an alkali metal chloride. The alkali metal chloride can be formed from an alkali metal. An atomic ratio of alkali metal to cadmium in the annealing compound can be less than 10,000 parts per million. The method for carrier activation can include annealing the absorber layer, whereby at least a portion of the Group V dopant is activated. After the absorber layer is annealed, the absorber layer can have a carrier concentration of the Group V dopant greater than $4\times10^{15}$ cm$^{-3}$.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device comprising an absorber layer, wherein:
   the absorber layer comprises cadmium, tellurium, and selenium;
   the absorber layer is doped p-type with a Group V dopant and has a carrier concentration of the Group V dopant greater than $4\times10^{15}$ cm$^{-3}$;
   the absorber layer comprises oxygen in a central region of the absorber layer;
   the absorber layer comprises an alkali metal in the central region of the absorber layer;
   a ratio of an atomic concentration of the alkali metal to an atomic concentration of the oxygen is at least 0.1 in the central region of the absorber layer; and
   the central region is the middle 50% of the absorber layer, which is offset by 25% of the thickness of the absorber layer from each of a first surface and a second surface of the absorber layer.

2. The photovoltaic device of claim 1, wherein the alkali metal is potassium.

3. The photovoltaic device of claim 1, wherein the alkali metal is rubidium.

4. The photovoltaic device of claim 1, wherein the carrier concentration of the Group V dopant is between $8\times10^{15}$ cm$^{-3}$ and $6\times10^{16}$ cm$^{-3}$.

5. The photovoltaic device of claim 4, wherein an atomic concentration of the Group V dopant in the central region of the absorber layer is greater than $1\times10^{17}$ cm$^{-3}$.

6. The photovoltaic device of claim 1, comprising a transparent conductive oxide layer disposed between the absorber layer and an energy side of the photovoltaic device, wherein the transparent conductive oxide layer comprises the alkali metal.

7. The photovoltaic device of claim 6, wherein an atomic concentration of the alkali metal in the transparent conductive oxide layer is greater than the atomic concentration of the alkali metal in the central region of the absorber layer.

8. The photovoltaic device of claim 7, wherein an alkali metal ratio of the atomic concentration of the alkali metal in the transparent conductive oxide layer to the atomic concentration of the alkali metal in the central region of the absorber layer is less than 1,000.

9. The photovoltaic device of claim 7, wherein an alkali metal ratio of the atomic concentration of the alkali metal in the transparent conductive oxide layer to the atomic concentration of the alkali metal in the central region of the absorber layer is less than 500.

10. The photovoltaic device of claim 7, wherein an alkali metal ratio of the atomic concentration of the alkali metal in the transparent conductive oxide layer to the atomic concentration of the alkali metal in the central region of the absorber layer is less than 100.

11. The photovoltaic device of claim 1, wherein the Group V dopant is arsenic.

12. The photovoltaic device of claim 1, wherein an atomic concentration of the Group V dopant in the central region of the absorber layer is between about $5\times10^{16}$ cm$^{-3}$ and about $1\times10^{19}$ cm$^{-3}$.

13. The photovoltaic device of claim 1, wherein the alkali metal comprises rubidium and potassium.

14. The photovoltaic device of claim 1, wherein the alkali metal comprises lithium.

15. The photovoltaic device of claim 1, wherein the Group V dopant comprises nitrogen, phosphorous, arsenic, antimony, bismuth, or a combination thereof.

16. The photovoltaic device of claim 1, wherein the ratio of the atomic concentration of the alkali metal to the atomic concentration of the oxygen is at least 0.75 in the central region of the absorber layer.

17. A photovoltaic device comprising an absorber layer, wherein:
   the absorber layer comprises cadmium, tellurium, and selenium;
   the absorber layer is p-type;
   the absorber layer is doped with a Group V dopant;
      the Group V dopant comprises at least one of: phosphorous, arsenic, antimony, or bismuth;
      an atomic concentration of the Group V dopant in a central region of the absorber layer is between about $3\times10^{17}$ cm$^{-3}$ and about $1\times10^{19}$ cm$^{-3}$;
   the absorber layer has a carrier concentration between $8\times10^{15}$ cm$^{-3}$ and $6\times10^{16}$ cm$^{-3}$;
   the absorber layer comprises an alkali metal in the absorber layer, wherein an atomic concentration of the alkali metal is between about $2\times10^{16}$ cm$^{-3}$ and about $1\times10^{19}$ cm$^{-3}$ in the absorber layer;
   the central region is the middle 50% of the absorber layer, which is offset by 25% of the thickness of the absorber layer from each of a first surface and a second surface of the absorber layer; and
   the alkali metal comprises at least one of potassium (K) or rubidium (Rb), wherein:
      the absorber layer comprises oxygen in the central region of the absorber layer; and
      an alkali metal to oxygen ratio is between about 0.1 and about 1,000 in the central region of the absorber layer.

* * * * *